(12) United States Patent
Chen

(10) Patent No.: US 7,852,065 B2
(45) Date of Patent: Dec. 14, 2010

(54) TESTING APPARATUS FOR TESTING ELECTRONIC SYSTEM WITH 4-WIRES RESISTIVE TOUCH PANEL AND THE METHOD THEREFOR

(75) Inventor: Chang-Yi Chen, Bade (TW)

(73) Assignee: Ideacom Technology Corporation, Taipei County (TW)

( * ) Notice: Subject to any disclaimer, the term of this patent is extended or adjusted under 35 U.S.C. 154(b) by 0 days.

(21) Appl. No.: 12/385,774

(22) Filed: Apr. 20, 2009

(65) Prior Publication Data

US 2010/0127711 A1    May 27, 2010

(30) Foreign Application Priority Data

Nov. 21, 2008    (TW) .............................. 97145099 A

(51) Int. Cl.
*G01R 31/04*    (2006.01)
*G01R 27/00*    (2006.01)

(52) U.S. Cl. .................... 324/158.1; 324/765; 324/770; 324/522; 345/173

(58) Field of Classification Search ............... 324/158.1, 324/552, 754–770; 345/173–174
See application file for complete search history.

(56) References Cited

U.S. PATENT DOCUMENTS

| 7,196,696 | B2 * | 3/2007 | Li | 345/173 |
| 2009/0166097 | A1 * | 7/2009 | Chang | 178/18.03 |
| 2010/0127713 | A1 * | 5/2010 | Chen | 324/537 |

* cited by examiner

*Primary Examiner*—Ha Tran T Nguyen
*Assistant Examiner*—Emily Y Chan
(74) *Attorney, Agent, or Firm*—Bacon & Thomas, PLLC

(57) ABSTRACT

The invention relates to a testing apparatus for 4-wires resistive touch panel of an electronic system. The testing apparatus includes a voltage control unit, a signal control unit, a connecting unit and a determining unit. The determining unit is used for determining the connection of a first electronic unit and a second electronic unit according to a first voltage level and a second voltage level generated by the voltage control unit and a detecting signal generated by the signal control unit.

12 Claims, 4 Drawing Sheets

US 7,852,065 B2

TESTING APPARATUS FOR TESTING ELECTRONIC SYSTEM WITH 4-WIRES RESISTIVE TOUCH PANEL AND THE METHOD THEREFOR

BACKGROUND OF THE INVENTION

1. Field of the Invention

The invention is related to a testing apparatus and a method for testing an electronic system, in specific to a testing apparatus and a method for testing connection of a 4-wires resistive touch panel of the electronic system.

2. Description of the Prior Art

Various kinds of touch sensing technology are used in many different electronic products in recently years for the progress in technology and the convenience in use. Touch pad is implemented in various kinds of electronic products because it has advantages in small size, less cost, low power assumption and durable life period.

No matter what kinds of electronic products, it must pass the standard functional test before being sold to customers. Taking a touch panel as an example, an electronic system with a touch panel comprises two parts including a panel and a control module. The panel is used for receiving the operation of press executed by a user. The control module is used for detecting the operation of press and for further executing the function according to the detected result. Therefore, when the function of the touch panel of the electronic system is tested, not only needs it to test both the touch panel and the control module respectively, the connection there between is also needed to be tested.

In general, the test of the connection between the touch panel and the control module is executed in a way of manual manner. If the circuit itself is properly connected according to the standard manner and there is not in any conditions of short circuit, open circuit or any other problem with the circuit, the control module will detect a normal signal which means the connection between the panel and control module is properly made. If not, it indicates that the connection has fault. After the electronic system passes the above test of connection, it will in sequence test other functional test to make sure the quality of the electronic system.

In trend of convenience and efficiency, the manner of manual test costs human source and time in testing the connection between the touch panel and the electronic system, and it also has disadvantage in that it can't be operated automatically. Therefore, how to improve the test manner of the touch panel of the electronic system and to provide an automatical, fast, convenient and accurate manner in testing the electronic system is an important topic for the manufacturer to produce the electronic system with touch panel.

SUMMARY OF THE INVENTION

It is therefore a primary objective of the present invention to provide a testing apparatus and a method for testing 4-wires resistive touch panel of an electronic system by testing the connection between a touch panel and a control module in a way of fast and automatical manner that enhances the efficiency and the convenience.

One embodiment of the present invention provides a testing apparatus for testing the 4-wires resistive touch panel of an electronic system which comprises a voltage control unit, a signal control unit, a first electronic unit, a second electronic unit, a connecting unit and a determining unit. The voltage control unit is used for generating a first voltage level and a second voltage level. The signal control unit is used for generating a testing signal. The first electronic includes a first terminal and a second terminal for generating a first output signal at the second terminal according to the testing signal received from the second terminal under a first test condition. The first electronic unit further receives the testing signal at the first terminal under a second test condition and setting the first terminal to second voltage level under a third test condition. The second electronic unit includes a first terminal and a second terminal for setting the first terminal and the second terminal to the first voltage level under the first test condition, generating a second output signal at the second terminal under the second test condition and setting the second terminal to the first voltage level under the third test condition. The connecting unit is used for connecting the first electronic unit and the second electronic unit under the second test condition and the third test condition. The determining unit coupled to the first electronic unit and the second electronic unit detects the status of the first electronic and the second electronic according to the first output signal, the second output signal and an output voltage level. Wherein the out voltage level generated between the first electronic unit and the second electronic unit located in the 4-wires resistive touch panel.

These and other objectives of the present invention will no doubt become obvious for those with ordinary skill in the art after reading the following detailed description of the preferred embodiment that is illustrated in the various figures and drawings.

DETAILED DESCRIPTION

Figure 1:
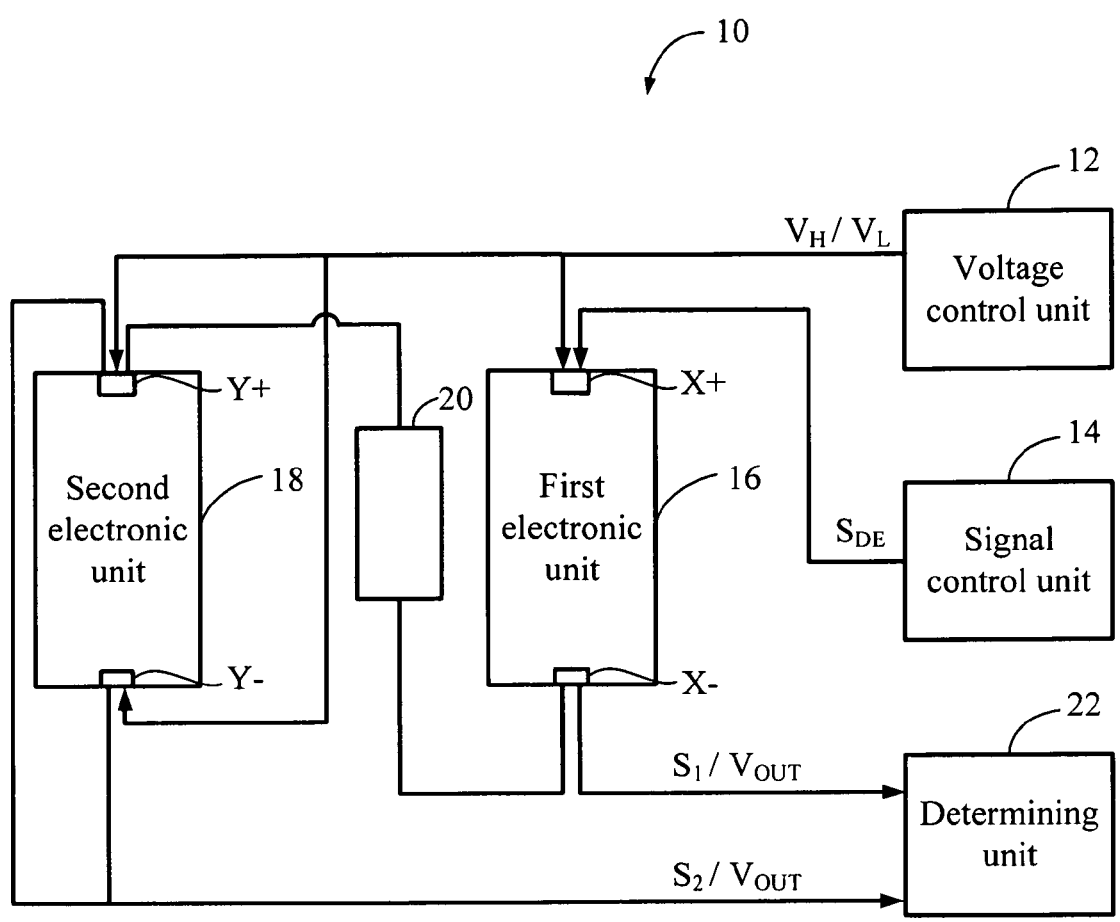
FIG. 1 is a schematic diagram of an embodiment of the testing apparatus for testing the 4-wires resistive touch panel of the electronic system according to the present invention.

Please referring to FIG. 1, FIG. 1 is a schematic diagram of an embodiment of the testing apparatus for testing 4-wires resistive touch panel of the electronic system according to the present invention. As shown in FIG. 1, the present invention is a testing apparatus for testing a 4-wires resistive touch panel of an electronic system 10. The testing apparatus comprises a voltage control unit 12, a signal control unit 14, a first electronic unit 16, a second electronic unit 18, a connecting unit 20 and a determining unit 22. The voltage control unit 12 is used for generating a first voltage level $V_L$ and a second voltage level $V_H$. In one of the embodiment the first voltage level $V_L$ is a low voltage level and the second voltage level $V_H$ is a high voltage level. The signal control unit 14 is used for generating a testing signal $S_{DE}$. The first electronic unit 16 includes a first terminal X+ and a second terminal X−. The first electronic unit 16 is used for generating a first output signal $S_1$ at the second terminal X− according to a testing signal $S_{DE}$ received from the first terminal X+ under a first test condition, receiving the testing signal $S_{DE}$ at the first terminal X− under a second test condition, and setting the first terminal X+ to a second voltage level $V_H$ under a second test condition. The second electronic unit 18 includes a first terminal Y+ and a second terminal Y− for setting the first terminal Y+ and the second terminal Y− to the first voltage level $V_L$ under the first test condition, generating a second output signal $S_2$ at the second terminal Y− under the second test condition, and setting the second terminal to a first voltage level $V_L$ under the third test condition. Wherein the first electronic unit 16 and the second electronic unit 18 are located in the 4-wires resistive touch panel.

Figure 2A:
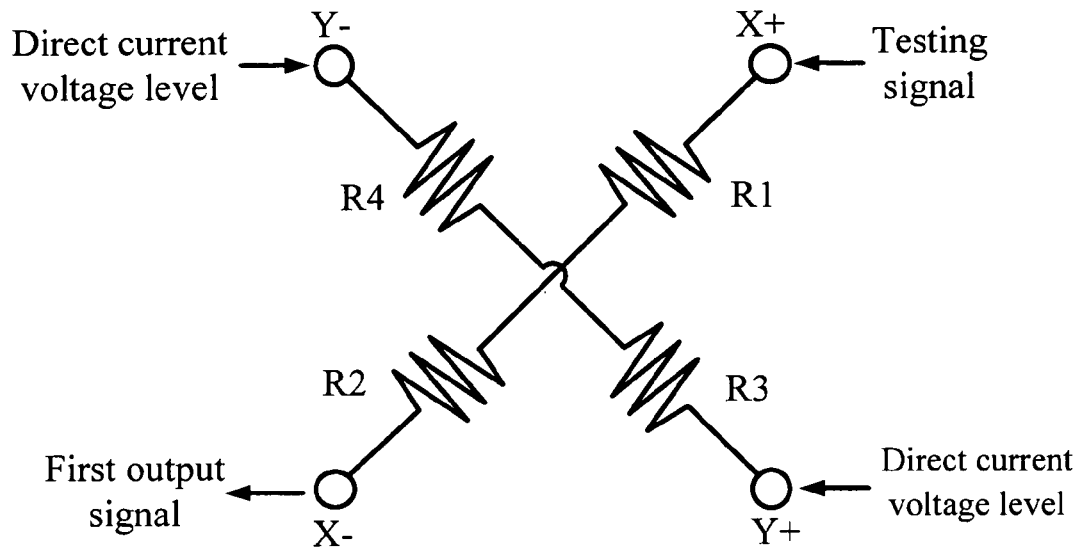
FIG. 2A to FIG. 2C are schematic diagrams of the three test conditions of the testing apparatus for testing the 4-wires resistive touch panel of the electronic system respectively according to the present invention.
Figure 2B:
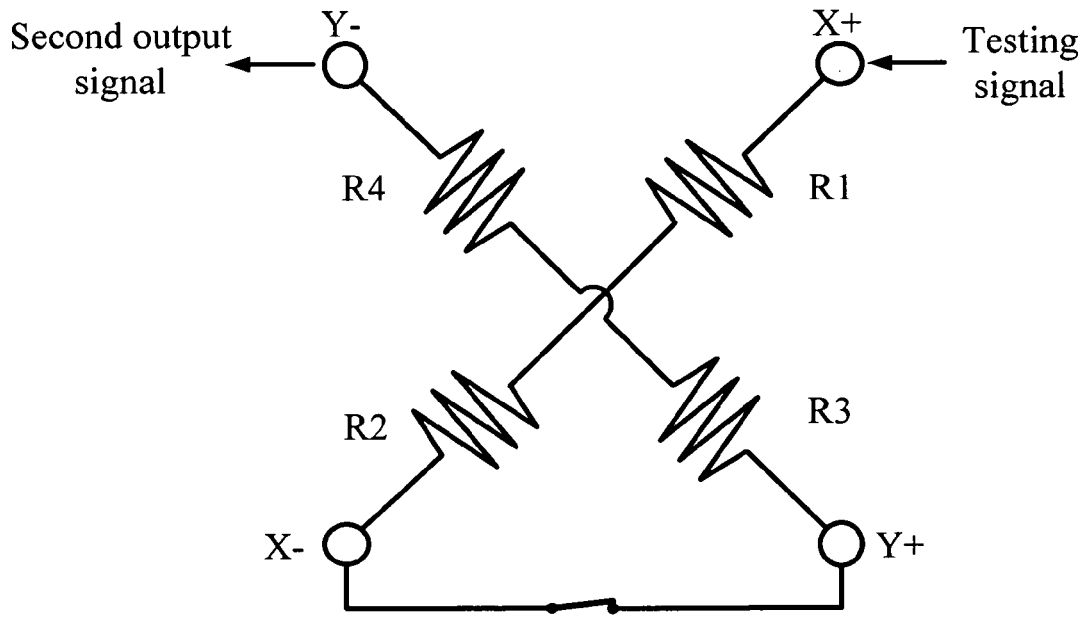

In one of the embodiment, Please referring to FIGS. 2A and 2B, FIGS. 2A and 2B are schematic diagrams of the first and second test conditions of the testing apparatus for testing the 4-wires resistive touch panel of the electronic system respectively according to the present invention. The first electronic unit 16 and the second electronic unit 18 includes two set series resistors $R_1$, $R_2$ and $R_3$, $R_4$ which are equivalent circuits in respect of the 4-wires resistive touch panel respectively. The connecting unit 20 is a switch for connecting the second terminal X− of the first electronic unit 16 and the first terminal Y+ of the second electronic unit 18 under the second and the third test conditions respectively. Furthermore the connecting unit 20 opens the connection between the first electronic unit 16 and the second electronic unit 18 under the first test condition.

The determining unit 22 coupled to the first electronic unit 16 and the second electronic unit 18 is used for determining the status of the first electronic unit 16 and the second electronic unit 18 according to the first output signal S1 and the second output signal S2 under the first test condition and the second test condition respectively, and determining the status of the first electronic unit 16 and the second electronic according to the output voltage level $V_{OUT}$, a first determined value and the second determined value under the third test condition. Under the third test condition, determining unit 22 determines the status of the first electronic unit 16 and the second electronic unit 18 according to the output voltage level $V_{OUT}$ generated between the first electronic unit 16 and the second electronic unit 18 situated between the first predetermined value and the second predetermined value or not. Because the connecting unit 20 has connected the second terminal X− of the first electronic unit 16 and the first terminal Y+ of the second electronic unit 18, the potential between the two terminals X− and Y+ are the same, and therefore it measures the output voltage level $V_{OUT}$ at any location between the two terminal X− and Y+ with the same voltage value.

Figure 2C:
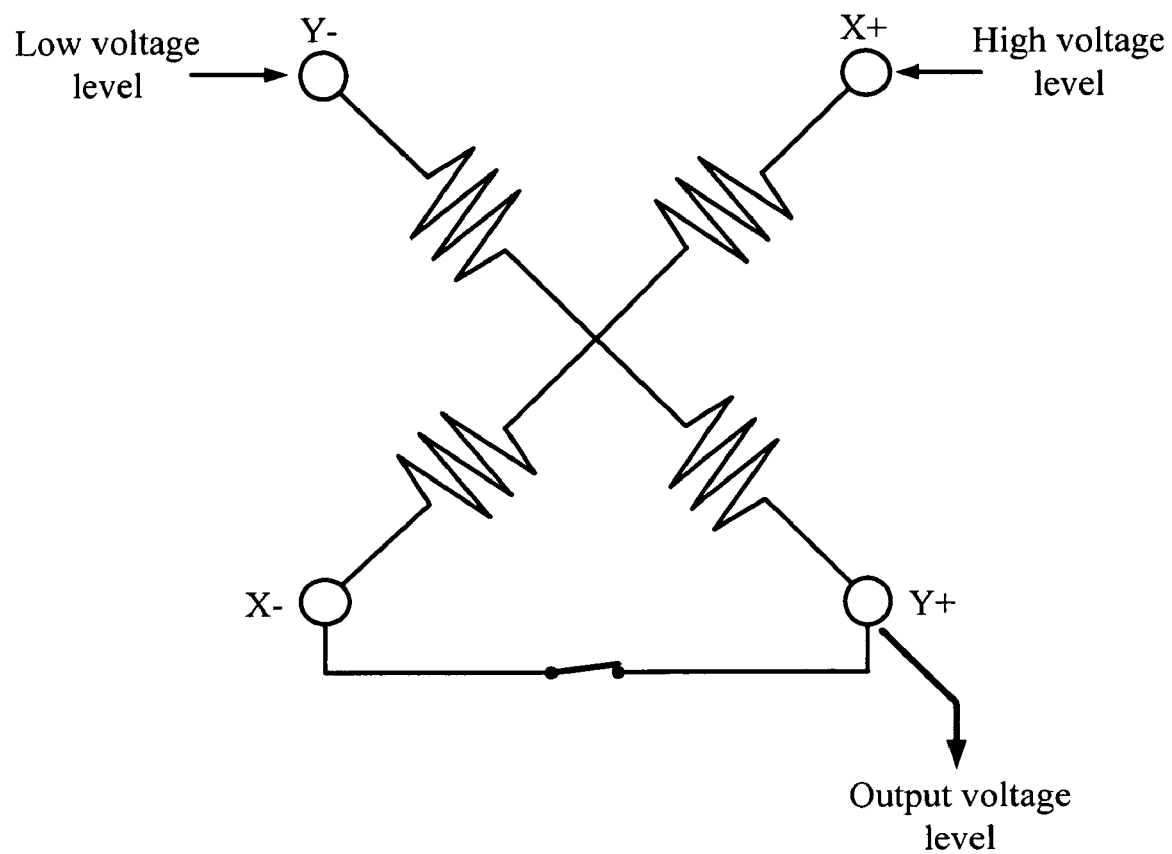

Please referring to FIGS. 1 and 2A to 2C, FIG. 2C is a schematic diagram of the third test condition of the testing apparatus for testing the 4-wires resistive touch panel of the electronic system according to the present invention. As shown in FIGS. 1 and 2A to 2C, the following description is used for explaining the operations of the testing apparatus for testing the 4-wires resistive touch panel of the testing apparatus, wherein the voltage control unit 12, signal controlling unit 14 and the determining unit 22 are located in the control chip (not shown) of the electronic system. In one of embodiment, the connecting unit 20 is a control switch and the first electronic unit 16 includes a first resistor R1 and a second resistor R2 (as shown in FIG. 2A to 2C). The first terminal X+ and the second terminal X− of the first electronic unit 16 in respect of an X+ terminal and an X− terminal in the 4-wires resistive touch panel respectively. The second electronic unit 18 includes a third resistor $R_3$ and the fourth resistor $R_4$ the first terminal Y+ and the second terminal Y− in respects of a Y+ terminal and a Y− terminal in the 4-wires resistive touch panel respectively.

Please referring to the FIG. 2A, the following description is used for explaining the first test condition of the testing apparatus 10, which includes 3 steps:

1. At first, setting the Y+ and Y− to the same direct current voltage level (usually connecting to the ground) or a signal different from the testing signal $S_{DE}$, receiving the testing signal $S_{DE}$ of the signal control unit 14 of the control chip (not shown) at the X+ terminal of the touch panel. The determining unit 22 of the control chip (not shown) measures the output signal $S_1$ at the x− terminal of the touch panel. The direct current voltage level described above is not limited to a specific level, the above embodiments are used to explain the operations of testing apparatus 10 for testing the touch panel of the present invention. User can choose the voltage level according to the actually condition, the voltage level can be any kind of signal which different from the testing signal $S_{DE}$ so that can be easily separated from the testing signal $S_{DE}$.

2. Comparing the output signal $S_1$ received from the X− terminal of the touch panel with the testing signal $S_{DE}$. If the output signal $S_1$ is different from the testing signal $S_{DE}$, the determining unit 22 determines the status of the 4-wires resistive touch panel abnormal, the electronic system disconnecting to the 4 wires resistive touch panel or the connection manner is incorrect.

3. If the output signal $S_1$ received from the X− terminal of the touch pane is the same as the testing signal $S_{DE}$ received from the x+ terminal of the touch panel, the determining unit 22 determines the connection between the 4-wires resistive touch panel is correct, the first electronic unit 16 (X axis path) and the second electronic unit 18 (Y axis path) is independent to each other, and these exists no influence and the disconnecting mistakes.

Please referring FIG. 2B, FIG. 2B is used for explaining the second test condition of the testing apparatus 10, which includes 3 steps:

1. Controlling the X+ terminal of the touch panel outputs the testing signal $S_{DE}$ the same as which outputted under the first test condition and then measuring the output signal S2 from the Y− terminal of the touch panel. Controlling the connecting unit 20 connects the X− terminal to the Y+ of the touch panel.

2. Comparing the output signal S2 at the Y− terminal of the touch panel with the testing signal $S_{DE}$ at the x+ terminal of the touch panel, if they are different from to each other, the determining unit 22 determines the status of the 4-wires resistive touch panel abnormal, the electronic system disconnecting to the 4 wires resistive touch panel or the connection manner is incorrect.

3. If the output signal S2 is the same as the testing signal $S_{DE}$, the determining unit 22 determines the connection between the 4-wires resistive touch panel is normal, the first electronic unit 16 (X axis path) and the second electronic unit 18 (Y axis path) is independent to each other, and there exists no any influence and the disconnecting incorrect.

Please referring FIG. 2C, FIG. 2C is used for explaining the third test condition of the testing apparatus 10, which includes 3 steps:

1. Connecting the X− terminal to the Y+ terminal of the touch panel by the connecting unit 20, the voltage control unit 12 of the control chip (not shown) outputs a high voltage level $V_H$ to the X+ terminal of the touch panel and a low voltage level $V_L$ to the Y− terminal of the touch panel. Measuring the output voltage level $V_{OUT}$ (usually connecting to the ground) from the Y+ terminal or the X− terminal of the touch panel. One of embodiment as shown in FIG. 2C measures the output voltage level $V_{OUT}$ at the Y+ terminal of the touch panel.

2. In theory, the output voltage level can be calculated according to the formula as shown as following:

$$\text{High voltage level (voltage of the power)} \times \frac{(R3+R4)}{(R1+R2)+(R3+R4)}$$

However, the resistance of the two series R1, R2, R3, R4 of the touch panel respectively are not the same as each other. The resistance of the resistor R1, R2, R3, R4 may has drafting due to the manufacturing process or the other reasons. In this step, the testing apparatus 10 predetermines two predetermined values such as a high voltage level and a low voltage level in the beginning, if the out voltage level situated between the range of the high voltage level and the low voltage level, the test apparatus 10 determines the output voltage level match the standard level.

3. Measuring and comparing the output voltage level $V_{OUT}$ between the X− terminal and the Y+ terminal of the touch panel with the two predetermined values, if the output voltage level $V_{OUT}$ is over the range, determines the electronic system disconnect to the 4-wires resistive touch panel, the status of the 4-wires resistive touch panel is abnormal, the electronic system disconnecting to the 4 wires resistive touch panel or the connection manner is incorrect. Wherein the determined result under the third test condition can used to check the testing result of the first or second test conditions to prevent from the error of test.

If the output voltage level situated between the range of the two predetermined values, determines the connection between the electronic system and the 4-wires resistive touch panel is normal and there has no problem with path of the X+ terminal and the X− terminal and the path of the Y+ terminal and Y− terminal of the touch panel.

After completed three different test conditions, if all the test result of the three test conditions are normal, it respect to the electronic system pass the test and can finish the test of the 4-wires resistive touch panel at this time. The three test conditions described above are used to determine the connection status of the 4-wires resistive touch panel respectively, the embodiment for completing three test conditions is a preferred test operation flow but it does not limited to complete all the three test conditions at one test operation. For example, when the testing apparatus 10 determines there has problem with the touch panel under the first test condition, it is not necessary to operate the second test condition and the third test condition. Furthermore, the sequence of the three test conditions also can be changed by the user according to the real testing operation situation.

Figure 3:
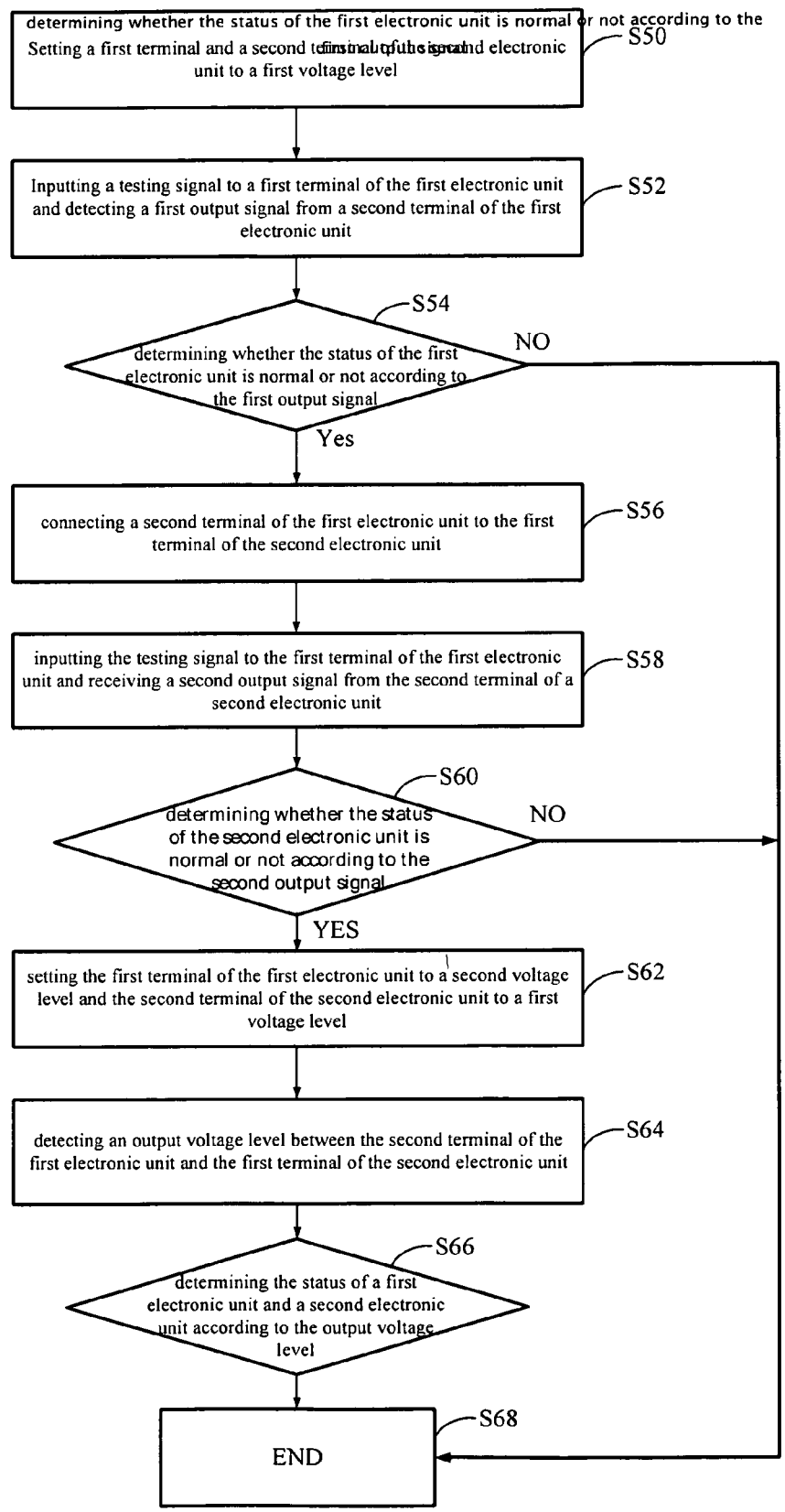
FIG. 3 is a flowchart diagram of an embodiment of the testing method for testing the 4-wires resistive touch panel of the electronic system according to the present invention.

Please refer to the FIG. 3, FIG. 3 is a flowchart diagram of an embodiment of the testing method for testing a 4-wires resistive touch panel of an electronic system according to the present invention. As shown in the FIG. 3, the present invention is a testing method for testing the status of a first electronic unit and a second electronic unit of a 4-wires resistive touch panel of an electronic system comprising the following steps:

Step 50: Setting a first terminal and a second terminal of the second electronic unit to a first voltage level;

Step 52: Inputting a testing signal to a first terminal of the first electronic unit and detecting a first output signal from a second terminal of the first electronic unit;

Step 54: determining whether the status of the first electronic unit is normal or not according to the first output signal. If yes, executing step S56; if not, executing to the step S68;

Step 56: connecting a second terminal of the first electronic unit to the first terminal of the second electronic unit;

Step 58: inputting the testing signal to the first terminal of the first electronic unit and receiving a second output signal from the second terminal of a second electronic unit;

Step 60: determining whether the status of the second electronic unit is normal or not according to the second output signal. If yes, executing step S62; if not, executing to the step S68;

Step 62: setting the first terminal of the first electronic unit to a second voltage level and the second terminal of the second electronic unit to a first voltage level; wherein the first voltage level is a low voltage level and the second voltage level is a high voltage level.

Step 64: detecting an output voltage level between the second terminal of the first electronic unit and the first terminal of the second electronic unit; and Step 66: determining the status of a first electronic unit and a second electronic unit according to the output voltage level. In one of the embodiment, this step determines the status of the first one electronic unit and the second electronic unit according to the output voltage level, a first predetermined value and a second predetermined value. This step further determines the status of the first electronic unit and the second electronic unit according to whether the output voltage level situated between the range of the first predetermined value and the second predetermined value or not.

S68: end.

As mentioned above, the present invention provides a testing apparatus and method for testing the connection of a 4-wires resistive touch panel of the touch panel instead of the testing manner by manual in the prior art. The testing apparatus of the present invention automatically inputs signal and voltage level via the control unit and then detects and determines the status of the electronic system by the determining unit to complete the test, which provides a testing apparatus and method that can enhance the convenience and the corrective. Accordingly, the descriptions above are the advantages of the testing apparatus and the method for testing a 4-wires resistive touch panel of an electronic system of the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing apparatus for testing a 4-wires resistive touch panel, the testing apparatus being connected to a first electronic unit and a second electronic unit of the 4-wires resistive touch panel, the first electronic unit having a first input terminal and a first output terminal, and the second electronic unit having a second input terminal and a second output terminal, the first electronic unit and the second electronic unit being overlapped but not contacted with each other, the testing apparatus comprising:

a voltage control unit, connected to the first input terminal, the second input terminal and the second output terminal, for generating a first voltage level, which is a low voltage level, and a second voltage level, which is a high voltage level;

a signal control unit, connected to the first input terminal, for generating a testing signal;

a connecting unit, connected to the first output terminal and the second input terminal, for switching the connection or disconnection therebetween; and a determining unit, connected to the first output terminal, the second input terminal and the second output terminal;

wherein, in a first test condition for testing the first electronic unit, the voltage control unit outputs the second voltage level to the both the second input terminal and the second output terminal, the signal control unit outputs the testing signal, and the connecting unit is switched to the disconnection so that the determining unit receives the signal from the first output terminal;

wherein, in a second test condition for testing the second electronic unit, the voltage control unit does not output any voltage level, the signal control unit outputs the testing signal, and the connecting unit is switched to a connection so that the determining unit receives the signal from the first output terminal;

wherein, in a third test condition for testing both the first electronic unit and the second electronic unit, the voltage control unit outputs the first voltage level to the first input terminal and outputs the second voltage level to the second output terminal, the signal control unit does not output the testing signal, and the connecting unit is switched to the connection so that the determining unit receives the signal from the first output terminal.

2. The testing apparatus for testing a 4-wires resistive touch panel of claim 1, wherein in the first test condition, the determining unit determines the first electronic unit normal when the output of the first output terminal is with the same voltage level as the testing signal, otherwise the determining unit determines the first electronic unit abnormal.

3. The testing apparatus for testing a 4-wires resistive touch panel of claim 1, wherein in the second test condition, the determining unit determines the second electronic unit normal when the output of the second terminal is with the same voltage level as the testing signal, otherwise the determining unit determines the second electronic unit abnormal.

4. The testing apparatus for testing a 4-wires resistive touch panel of claim 1, wherein in the third test condition, the determining unit determines the first and second electronic units are both normal when an output voltage received by the determining unit falls between the low voltage level and the high voltage level, otherwise the determining unit determines both the first electronic unit and second electronic unit abnormal.

5. The testing apparatus for testing a 4-wires resistive touch panel of claim 1, wherein the first electronic unit and the second electronic unit includes two series resistors respectively.

6. The testing apparatus for testing a 4-wires resistive touch panel of claim 1, wherein the connecting unit is a switch.

7. A testing method of the testing apparatus of claim 1, comprising the steps of:
(a) in a first test condition for testing the first electronic unit, the voltage control unit outputs the second voltage level to the both the second input terminal and the second output terminal, the signal control unit outputs the testing signal, and the connecting unit is switched to the disconnection so that the determining unit receives the signal from the first output terminal;
(b) in a second test condition for testing the second electronic unit, the voltage control unit does not output any voltage level, the signal control unit outputs the testing signal, and the connecting unit is switched to a connection so that the determining unit receives the signal from the first output terminal;
(c) in a third test condition for testing both the first electronic unit and the second electronic unit, the voltage control unit outputs the first voltage level to the first input terminal and outputs the second voltage level to the second output terminal, the signal control unit does not output the testing signal, and the connecting unit is switched to the connection so that the determining unit receives the signal from the first output terminal;
wherein the above steps are performed independently or dependently.

8. The testing method claim 7, wherein the step (a) determines the first electronic unit is normal when the output of the first output terminal is the same voltage level as the testing signal, otherwise the determining unit determines the first electronic unit is abnormal.

9. The testing method of claim 7, wherein the step (c) determines both the first electronic unit and the second electronic unit when the output voltage level falls between the low voltage level and the high voltage level.

10. The testing method of claim 7, wherein the first electronic unit and the second electronic unit include two series resistors respectively.

11. The testing method of claim 7, wherein the connecting unit is a switch.

12. The testing method of claim 7, wherein the step (b) determines the second electronic unit normal when the output of the second terminal is the same voltage level as the testing signal, otherwise the determining unit determines the second electronic unit is abnormal.

* * * * *